United States Patent [19]

Abele

[11] Patent Number: 4,461,822
[45] Date of Patent: Jul. 24, 1984

[54] PROCESS FOR TONING IMAGE-WISE MODIFIED SURFACES

[75] Inventor: Werner Abele, Neu-Isenburg, Fed. Rep. of Germany

[73] Assignee: E. I. Du Pont de Nemours and Company, Wilmington, Del.

[21] Appl. No.: 532,312

[22] Filed: Sep. 15, 1983

[30] Foreign Application Priority Data

Nov. 11, 1982 [DE] Fed. Rep. of Germany ....... 3241732

[51] Int. Cl.$^3$ ............................................ G03G 13/16
[52] U.S. Cl. ....................................... 430/97; 430/45; 430/106; 430/291; 430/292; 430/293
[58] Field of Search ................. 430/292, 293, 45, 106, 430/291, 97

[56] References Cited

U.S. PATENT DOCUMENTS 3,060,024 10/1962 Burg & Cohen ....................... 96/28
3,620,726 1/1968 Fu-Hua Chu .................... 430/357 X
3,649,268 3/1972 Chu et al. ........................ 430/259 X
3,909,282 9/1975 Gray ................................ 106/288 Q
4,174,216 11/1979 Cohen et al. .................... 430/258 X
4,215,193 7/1980 Manger et al. .................. 430/292 X
4,346,162 8/1982 Abele ................................. 430/270

FOREIGN PATENT DOCUMENTS 81101205 2/1981 European Pat. Off. .

Primary Examiner—John E. Kittle
Assistant Examiner—Mukund J. Shah

[57] ABSTRACT

Process for toning imagewise tacky surfaces by multiple application of at least two toners containing different low melting compounds having a polar substituent and melting in the range of 25° to 110° C., which in contact with one another render the toners tacky at room temperature thus yielding higher color density or change of color tone.

8 Claims, No Drawings

PROCESS FOR TONING IMAGE-WISE MODIFIED SURFACES

DESCRIPTION

1. Technical Field

This invention relates to a process for increasing the color density or for changing the color tone of a surface. More particularly this invention relates to a process for toning a surface image-wise by multiple application of toner.

2. Background Art

It is known to make visible a latent image produced by exposure on a light sensitive material by treating the surface of the material with a colored toner. Such toning processes are used in electrostatic and electromagnetic processes as well as in color testing processes using photopolymerizable or photo-plastifiable materials, whose image areas comprise tacky and nontacky areas. The application of the toner takes place either manually or by machines.

The used toners are powders which contain a coloring agent and predominately a polymeric binder which improves the handling of the toners.

It is also known to add low melting organic compounds to toners in order to lower the glass transition temperature of the polymeric binders so far that they become tacky when heated to over 50° C. Such so-called "prolonged delayed tack" toners are described in European Patent Application EU 0 034 816. They are used, e.g., in a process, where the tacky image portion on a substrate is coated with the toner at room temperature, whereby a nontacky image is formed. During the following processing step the toned image is then heated, until the toner becomes tacky. Subsequently the temperature of the toned image is lowered below the activation temperature of the toner, whereby, however, the toner remains tacky and the same toner is used repeatedly in order to increase the density of the toned image. The heating necessary for the process represents an increased operating expenditure and, additionally, it cannot be carried out with other reproduction processes, since the image supports used there, such as paper or polyester, would be damaged by the increased temperature or at least their dimensional stability would be impaired.

Therefore, it has been necessary up to now with such processes to be bound to the density and the color tones, which were obtained with the one time toning process, which already brought about a complete coating of the surface, so that additional toners could hardly be adhered.

In some areas of application, e.g., in the preparation of transparent images, the necessary color density is not achieved by the one time toning process. In other applications a certain color tone must be adjusted. A correction of a one time toned image, e.g., a shift to warmer (more reddish) or colder (more bluish) color tones could not be accomplished up to now, so that a new image had to be prepared using a suitable toner.

DISCLOSURE OF THE INVENTION

In accordance with the invention there is provided a process for increasing the color density or for changing the color tone of an image-wise modified surface which comprises applying consecutively to a tacky image at room temperature at least two different toners each containing at least one different organic compound having a polar substituent, and melting in the range of 25° to 110° C. so chosen that said toners when in contact with each other become and remain tacky.

During the first toning step with toner I, which contains a low melting organic compound A, an image of conventional density is built up. The excess, nonimage-wise-adhering toner is removed. During the second toning step with toner II, which contains a low melting organic compound B, the first toned areas are again made tacky, so that they will take up additional toners. This process can, if necessary, be repeated with additional toners containing other low melting organic compounds. If all toners have the same color tone, then the density is considerably increased. If the toners have different color tones, then an image with changed color tone will result. The resolution in both instances remains good.

This result is surprising to the extent, that it would have been expected by those skilled in the art, that contamination by the toner would occur in the parts not imagewise exposed by the tackiness produced during the second toning step, so that the fine image structures would be cemented or adhered and the image resolution would be decreased.

The low melting organic compounds having a melting point in the range of 25° to 110° C., preferably 30° to 80° C., which are added to the toner for carrying out the process of the invention (designated above as A, B, etc.) can be selected from various compound classes with polar groups.

Thus, e.g., the compounds listed in Tables 1–7 are suitable.

TABLE 1

| Suitable Compounds with hydroxyl groups | Melting Point (°C.) |
| --- | --- |
| Benzohydrol | 68 |
| 4-chlorobenzyl alcohol | 71 |
| 2-hydroxybenzyl alcohol | 86 |
| 4-pyridyl methanol | 58 |
| Cyclododecanol | 78 |
| 1,8-octanediol | 60 |
| 1,10-decanediol | 71 |
| Phenylethylene glycol | 64 |
| 2,4-di-tert-butylphenol | 56 |
| 2,6-di-tert-butyl-4-methylphenol | 71 |

TABLE 2

| Suitable Compounds with Ether Groups | Melting Point (°C.) |
| --- | --- |
| Diphenylether | 27 |
| 3-methoxynaphthalene | 73 |
| 4-methoxyphenol | 56 |
| Benzoin ethyl ether | 62 |
| Phloroglucinol-trimethylether | 54 |

TABLE 3

| Suitable Compounds with keto-groups | Melting Point (°C.) |
| --- | --- |
| Benzophenone | 49 |
| 1,1-diphenylacetone | 60 |
| 1,3-diphenylacetone | 34 |
| Cyclododecanone | 62 |
| 4-chlorobenzophenone | 75 |
| 2-hydroxy benzophenone | 37 |
| 4'-chloropropiophenone | 35 |
| Phenyl-2-pyridyl ketone | 42 |
| 1-phenyl-2-pyrrolidone | 67 |

TABLE 4

| Suitable Compounds with amide groups | Melting Point (°C.) |
| --- | --- |
| N—benzyl formamide | 49 |
| N—methylacetamide | 32 |
| N,N—diphenylacetamide | 101 |
| Propionamide | 78 |
| Thiopropionylanilide | 67 |
| p-Toluene sulfonic acid-N—propylamide | 52 |
| p-Toluene sulfonic acid-N—methylamide | 79 |

TABLE 5

| Suitable Compounds with ester groups | Melting Point (°C.) |
| --- | --- |
| Benzoic acid phenylester | 71 |
| 1-naphthyl acetate | 46 |
| Dimethyloxalate | 54 |
| Diphenylcarbonate | 79 |
| Cinnamic acid benzyl ester | 49 |
| Triphenyl phosphate | 51 |

TABLE 6

| Suitable Compounds with carboxylic acid groups | Melting Point (°C.) |
| --- | --- |
| 3-phenylpropionic acid | 49 |
| 3-methoxyphenyl acetic acid | 67 |
| 4-methoxyphenyl acetic acid | 86 |
| Phenoxy acetic acid | 100 |

TABLE 7

| Suitable Compounds with sulfoxide and/or sulfone groups | Melting Point (°C.) |
| --- | --- |
| Diphenylsulfoxide | 70 |
| Tetramethylene sulfone | 27 |
| Butadiene sulfone | 65 |

Especially preferred are such compounds which liquefy upon being mixed together.

The selection of specially suitable compounds additionally depends on their compatibility with the polymeric compounds (binders) present in the toner and can be quickly determined by simple small scale tests, in that the solubility of the used polymeric binder is tested in a mixture of low melting organic compounds at room temperature. The concentration of the low melting organic compounds depends on the desired change of density or color tone and can be between 10 and 60 wt.-%, whereby the greater the sought change, the higher the concentration. It also depends on the absorptive capacity of the substrate used and can, e.g., be higher with paper than with nonabsorptive substrates. The toners, to which these low melting organic compounds are added, consist essentially of a coloring agent and predominately a polymeric binder.

Pigments, dispersion dyes and soluble dyes can be used as coloring agents. Examples of suitable pigments include: titanium dioxide, colloidal carbon, graphite, phosphor substances, ceramic powder, varieties of clay and metal powders, e.g., aluminum, copper, iron or bronze, etc.

Also, Pigment Red 122 (no C.I. number assigned), Pigment Red 123 (C.I. 71145), Black No. 88 (copper chromite), Dalamar Yellow (Pigment Yellow 74, C.I. 11741), Pigment Blue 15 (C.I. 74160), Pigment Green 7 (C.I. 74260) and Pigment Yellow 101 (C.I. 48052) are suitable as pigments.

Suitable dispersion dyes are Latyl Blue BCN (C.I. Disperse Blue 56), Latyl yellow 36 (C.I. Disperse Yellow 54, C.I. 47020), Latyl Cerise N (C.I. Disperse Red 60, C.I. 60756), C.I. Disperse Violet 28 (C.I. 61102), the dye Sinclair and Valentine Brown 50-1301-06 and the Blue Dispersion Dye C.I. 14 (C.I. 61500), the dye Sinclair and Valentine Blue 50-0305-06 and the Blue Dispersion Dye C.I. 14 (C.I. 61500), Magenta C.I. 17 (C.I. 11210) and Disperse Red 60 (C.I. 60756).

Examples of suitable soluble dyes are Fuchsin (C.I. 42510), Auramin base (C.I. 410008), Calcocide Green S (C.I. 44090), Para-Magenta (C.I. 42500), Tryparosan (C.I. 42505), New-Magenta (C.I. 42520), Acid Violet RRL (C.I. 42425), Red Violet 5 RS (C.I. 42690), Nile Blue 2 B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10 B (C.I. 27790), Naphthaline Black 12 R (C.I. 20350), Quick Black L (C.I. 51215), Ethyl Violet (C.I. 42600), Oil Scarlet 6 G (C.I. 12140) and Monastral Blue B (C.I. 74150). Also suitable combinations of these dyes can be used. U.S. Pat. No. 3,060,024 discloses many of the above materials.

To improve handling, the coloring agents can be mixed with solid polymeric materials in powder form, into which the coloring agent is either embedded or on whose surface the coloring agent is absorbed. Such polymeric compounds can consist of polyvinyl chloride, cellulose acetate, cellulose acetobutyrate, polymethylmethacrylate, and polybutylmethacrylate. Especially preferred as resin is cellulose acetate with a viscosity of ca. 16 Pa and an acetyl-content of ca. 39 wt.-%.

Especially preferred for carrying out the process of the invention are thermoplastic polymers, which are plastified by their mixture with liquified low-melting compounds and thereby become tacky.

The preparation of the toners is carried out in known manner per se, as described, e.g., in U.S. Pat. No. 3,620,726. The low melting organic compounds are added to the toner powders produced. For example as the toners are pulverized in a ball mill, eventually while cooling to a particle size of 0.2 to 30 μm, the low melting organic compounds at the same time are uniformly blended with the toners.

INDUSTRIAL APPLICABILITY

The process of this invention is useful for increasing the density or changing the color tone of tacky images, e.g., prepared from photosensitive materials such as photohardenable or photoplastifiable materials. The process operates at normal room temperature conditions with standard toners to which have been added a variety of low melting organic compounds as described above. The results are surprising since there is substantially no fogging of the toned image and the image resolution is good.

EXAMPLES

The following examples illustrate the invention wherein the parts and percentages are by weight and the melting points are in °C. $\overline{M}w$ is weight average molecular weight, $\overline{M}n$ is number average molecular weight and PD1 is polydispersity index.

EXAMPLE 1

Preparation of a Photohardenable Film

A photohardenable film of the following composition is cast in a 0.01 mm thickness onto a polyethylene terephthalate substrate (thickness 0.18 mm) provided with an adhesive layer:

| Ingredients | Parts |
| --- | --- |
| Polymethylmethacrylate, $\overline{M}w$ is 629,000, $\overline{M}n$ 129,000 PDI is 4.86 | 19.30 |
| Polyvinylacetate, $\overline{M}w$ is 120,000 $\overline{M}n$ is 512, PDI is 234 | 19.30 |
| Trimethylolpropane trimethylacrylate | 40.60 |
| Polyoxyethylated trimethylolpropane-triacrylate | 9.10 |
| Polyethylene glycol-4-lauryl ether | 9.10 |
| Dimer of 2-o-chlorophenyl-4,5-diphenylimidazole | 1.60 |
| 2,2'-dihydroxy-4-methoxy-benzophenone | 0.08 |
| 2-(Stilbyl-4")-(naphtho-1',2',4,5)-1,2,3-triazole-2" sulfonic acid phenylester | 0.20 |
| 2-mercaptobenzothiazole | 0.80 |

The photohardenable material is laminated at 104° C. on the smooth side of a barytated paper substrate. The pressure rollers of the laminator are adjusted so that a crease and bubble-free laminate is formed. The laminate is placed with the coated side facing the light source in a vacuum frame and is exposed in contact with a screened positive yellow separation with a 1800 Watt high pressure mercury vapor lamp for 3 seconds with a radiation of 0.27 Watt/cm$^2$. The exposed image portions are polymerized by this exposure and become nontacky, while the unexposed image portions remain tacky.

The photohardened material is then removed from the vacuum printing frame and the polyethylene terephthalate film is removed. Subsequently, a yellow toner (A) is applied using a cotton pad, whereby the toner particles remain adhered to the unexposed tacky image portions. The toned image portions are rubbed with a cotton pad in order to make the surface smooth and glossy.

The total image is then toned with a Magenta toner (B) and is cleaned with a cotton pad. An orange colored image is formed.

A second sheet of the same photopolymerizable material is exposed in the same manner, then, however, is toned with the yellow and magenta toners, which do not contain any low melting compounds. It is seen, that the yellow toner is only slightly changed, because the additional magenta toner does not remain adhered.

| Ingredients | Amount (%) |
| --- | --- |
| Toner (A) | |
| Yellow dye toner, Tartrazine (C.I. 19140) and cellulose acetate binder | 66 |
| Cinnamic Acid benzyl ester (M.P. 49) | 34 |
| Toner (B) | |
| Magenta dye toner, Fuchsine (C.I. 42510) and cellulose acetate binder | 50 |
| p-Toluene sulfonic acid-N—methyl-amide (M.P. 79) | 50 |

EXAMPLE 2

Example 1 is repeated, however, exposure is carried out in contact with a screened positive magenta separation and toning is first with magenta toner (C) and next with cyanotoner (D).

| Ingredients | Amount (%) |
| --- | --- |
| Toner (C) | |
| Magenta toner as described in Example 1 | 50 |
| Benzohydrol (M.P. 68) | 50 |
| Toner D | |
| Cyanotoner, Calcocid Green S (C.I. 44090) and cellulose acetate binder | 66 |
| Benzophenone (M.P. 49) | 34 |

A violet colored image is formed.

If in place of Toner C and Toner D, toners without benzohydrol and benzophenone are used, a magenta color image is obtained, because the cyanotoner does not remain adhered to the image portions colored with the magenta toner.

EXAMPLE 3

Example 2 is repeated, whereby first 40 cycles, i.e., 40-fold repetition of the wiping process with the cotton pad, are used for toning with the magenta toner (C). This toner contains 20% cinnamic acid benzylester as the low melting compound.

Example 2 is again repeated, however, toning is carried out with 40 cycles of the magenta toner (E), containing 50% 1-naphthyl acetate (M.P. 46). The maximum and minimum densities of the two images are measured.

In a third test the image is first toned 20 cycles with magenta toner (C) and then 20 cycles with magenta toner (E). In a comparative test an image is toned with the magenta toner containing no low melting organic compound.

The magenta densities are summarized in the following table. According to Table 8 the maximum densities obtained with the process of the invention are clearly above the densities obtained with magenta toners without additives and/or with the individual use of magenta toners (C) and (E) with low melting organic compounds, while the minimum magenta densities remained low (unchanged).

TABLE 8

| | Maximum Density | Minimum Density |
| --- | --- | --- |
| 40 cycles magenta toner without addition | 1.15 | 0.02 |
| 40 cycles magenta toner (C) | 1.12 | 0.02 |
| 40 cycles magenta toner (E) | 1.10 | 0.02 |
| 20 cycles toner (C) + 20 cycles toner (E) | 1.23 | 0.02 |

EXAMPLE 4

Example 1 is repeated, whereby the photohardenable material after removal of the polyethylene terephthalate film is toned with a blue dye ceramic powder using a cotton pad.

The composition of ceramic powders for melting onto clay materials is described, e.g., in "Ullmanns Enzyklopaedie der techn. Chemie", 3rd edition, p. 425 ff.

A repetition using the two modified toners (F) and (G), containing 33% benzophenone and 35% triphenyl phosphate, respectively, leads to a slight drop and increase in color density. If, on the other hand, these toners are applied consecutively according to the process of the invention there is a substantial increase of density:

TABLE 9

|  | Maximum Density | Minimum Density |
|---|---|---|
| Blue ceramic toner | 1.90 | 0.02 |
| Blue ceramic toner + 33% benzophenone (F) (M.P. 49) | 1.88 | 0.02 |
| Blue ceramic toner + triphenyl phosphate (M.P. 51) | 1.92 | 0.02 |
| Toner (F) + Toner (G) | 2.06 | 0.02 |

EXAMPLE 5

Preparation of a Photoplastifiable Film

A photoplastifiable film with the following composition is cast in a 0.03 mm thickness onto a 19 μm polypropylene film:

| Ingredients | Parts |
|---|---|
| Polymethylmethacrylate as described in Example 1 | 20.63 |
| Polyoxyethylene-(4)-monolaurylether | 7.22 |
| Triethylene glycol diacetate | 4.13 |
| Benzophenone | 3.13 |
| Dimer of 2,4,5-triphenylimidazole | 13.53 |
| Dimer of 2-(o-chlorophenyl), 4,5,-diphenylimidazole | 15.11 |
| Dimer of 2-(2'-methoxy phenyl), 4,5-diphenylimidazole | 14.90 |
| 1,4-dihydro-2,4,6-trimethyl-3,5-di-(carbethoxy)-pyridine | 4.59 |
| 1,4-dihydro-2,6-dimethyl-4-ethyl-3,5-di(carbethoxy)-pyridine | 4.83 |
| 1,4-dihydro-2,6-dimethyl-4-propyl-3,5-di(carbethoxy)-pyridine | 5.07 |
| 1,4-dihydro-2,6-dimethyl-4-benzyl-3,5-di(carbethoxy)-pyridine | 5.89 |
| Hydroquinone | 0.48 |
| Polyethylene oxide, $\overline{M}n$ is ca. 4,000,000 | 0.48 |

A silicon-treated 0.25 mm thick polyethylene terephthalate film is laminated onto the layer as a protective film. This material is laminated onto barytated paper after removal of the protective film, whereby the lamination temperature is ca. 90° C.

The pressure rollers of the laminator instrument are adjusted so that a crease and bubble-free laminate is formed. The laminate is placed with the layer side facing the light source in a vacuum printing frame and is exposed in contact with a screened negative cyano-separation using a 1800 Watt high pressure mercury vapor lamp for 30 seconds with a radiation of 0.27 Watt/cm². The exposed image portions become tacky by this exposure, while the unexposed image portions remain nontacky.

The exposed material is then removed from the vacuum printing frame and the polypropylene film is removed. Subsequently the cyano-toner (H) is applied using a cotton pad whereby the toner parts remain adhered to the exposed tacky image portions. The toned image portions are rubbed in order to produce a smooth and glossy surface. Subsequently the total image is toned with the cyano-toner (I), whereby there is a clear increase in density.

Using the same cyano-toner, which, however, does not contain a low melting compound, even after repeated toning, only a substantially low maximum density is achieved.

| Ingredients | Amount (%) |
|---|---|
| Toner (H) | |
| Cyanotoner as described in Example 2 | 66 |
| Triphenyl phosphate (M.P. 51) | 34 |
| Toner (I) | |
| Cyanotoner as described in Example 2 | 66 |
| Benzophenone (M.P. 49) | 34 |

TABLE 10

|  | Maximum Density | Minimum Density |
|---|---|---|
| Cyanotoner | 1.22 | 0.03 |
| Toner (H) | 1.15 | 0.03 |
| Toner (I) | 1.20 | 0.03 |
| Toner (H) + Toner (I) | 1.35 | 0.04 |

EXAMPLE 6

The photoplastifiable film described in Example 5 is toned 40 cycles after exposure with a black toner prepared according to U.S. Pat. No. 3,620,726. Additionally, images are prepared with modified toners K and L, which likewise are toned for 40 cycles each. Finally a fourth exposed image is toned 20 cycles with Toner K and 20 cycles with Toner L. The maximum densities obtained with these are summarized in Table 11. According to this table the maximum density achieved with the process of the invention is clearly higher than with other tests.

TABLE 11

|  | Maximum Density | Minimum Density |
|---|---|---|
| 40 cycles black toner | 1.25 | 0.03 |
| 40 cycles black toner (K) + 50% 1-naphthylacetate (M.P. 46) | 1.20 | 0.03 |
| 40 cycles black toner (L) + 50% triphenyl phosphate (M.P. 51) | 1.29 | 0.04 |
| 20 cycles each of Toner (K) + Toner (L) | 1.42 | 0.04 |

EXAMPLE 7

Example 8 of U.S. Pat. No. 4,346,162 is repeated for the preparation of a black semi-tone image on polyethylene terephthalate fabric, whereby a photoplastifiable film comprising thioamides, hexarylbisimidazole compounds and binders on a white pigmented polyethylene terephthalate support is exposed in contact with a semi-tone cover sheet. Subsequently it is toned with a toner comprising a sublimable black dye. The black print thus prepared is heated in contact with the polyethylene terephthalate fabric for 1 minute to 200° C. A black semi-tone on the polyethylene terephthalate fabric is obtained.

Additionally, the toner prepared with a sublimable black dye is modified with 50% benzophenone (Toner M) or 50% triphenyl phosphate (Toner N) and the exposed semi-tone image is toned according to the process of the invention. The black print thus prepared is likewise heated in contact with the polyethylene terephthalate fabric for 1 minute to 200° C.

A black semi-tone image on the polyethylene terephthalate fabric is obtained exhibiting a clearly higher blackiness than according to the above-mentioned example.

I claim:

1. A process for increasing the color density or for changing the color tone of an image-wise modified surface which comprises applying consecutively to a tacky image at room temperature at least two different toners each toner containing at least one different organic compound having a polar substituent, and melting in the range of 25° to 110° C., said toners when in mutual contact make each other tacky.

2. A process according to claim 1 wherein the organic compounds melt in the range of 30° to 80° C.

3. A process according to claim 1 wherein the organic compounds have a polar substituent taken from the group consisting of hydroxyl, ether, keto, ester, amide, carboxylic acid, sulfoxide, and sulfone.

4. A process according to claim 1 wherein the organic compounds applied are taken from the group consisting of benzophenone, benzohydrol, triphenyl phosphate and cinnamic acid benzyl ester.

5. A process according to claim 1 wherein the toners have present plastifiable polymer particles.

6. A process according to claim 5 wherein the plastifiable polymer particles are cellulose acetate particles.

7. A process according to claim 1 wherein different toners of the same color are used.

8. A process according to claim 1 wherein different toners of different colors are used.

* * * * *